# United States Patent
Bergman (10) Patent No.: US 6,843,857 B2
(45) Date of Patent: Jan. 18, 2005

(54) METHODS FOR CLEANING SEMICONDUCTOR SURFACES

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/681,553

(22) Filed: Oct. 7, 2003

(65) Prior Publication Data

US 2004/0069320 A1 Apr. 15, 2004

Related U.S. Application Data

(63) Continuation of application No. 09/811,925, filed on Mar. 19, 2001, which is a continuation of application No. 08/853,649, filed on May 9, 1997, now Pat. No. 6,240,933.

(51) Int. Cl.$^7$ ............................................. B08B 3/00
(52) U.S. Cl. ........................ 134/28; 134/3; 134/19; 134/26; 134/30; 134/31; 134/33; 134/34; 134/36; 134/37; 438/906
(58) Field of Search ................. 134/3, 19, 26, 134/28, 30, 31, 33, 34, 36, 37; 438/906

(56) References Cited

U.S. PATENT DOCUMENTS

| | | |
|---|---|---|
| 3,898,141 A | 8/1975 | Ermanis et al. |
| 4,050,954 A | 9/1977 | Basi |
| 4,186,032 A | 1/1980 | Ham |
| 4,261,791 A | 4/1981 | Shwartzman |
| 4,264,374 A | 4/1981 | Beyer et al. |
| 4,615,762 A | 10/1986 | Jastrzebski |
| 4,695,327 A | 9/1987 | Grebinski |
| 4,749,440 A | 6/1988 | Blackwood et al. |
| 4,817,652 A | 4/1989 | Liu et al. |
| 4,899,767 A | 2/1990 | McConnell |
| 4,917,123 A | 4/1990 | McConnell et al. |
| 4,943,540 A | 7/1990 | Ren et al. |
| 4,971,654 A | 11/1990 | Schnegg et al. |
| 4,974,530 A | 12/1990 | Lyon |
| 5,055,138 A | 10/1991 | Slinn |
| 5,063,609 A | 11/1991 | Lorimer |
| 5,105,556 A | 4/1992 | Kurokawa et al. |
| 5,120,370 A | 6/1992 | Mori et al. |
| 5,129,955 A | 7/1992 | Tanaka |
| 5,158,100 A | 10/1992 | Tanaka et al. |
| 5,181,985 A | 1/1993 | Lampert et al. |
| 5,221,423 A | 6/1993 | Sugino et al. |
| 5,232,511 A | 8/1993 | Bergman |
| 5,234,540 A | 8/1993 | Grant et al. |
| 5,235,995 A | 8/1993 | Bergman et al. |
| 5,238,500 A | 8/1993 | Bergman |
| 5,244,000 A | 9/1993 | Stanford et al. |
| 5,246,526 A | 9/1993 | Yamaguchi et al. |
| 5,248,380 A | 9/1993 | Tanaka |
| 5,294,570 A | 3/1994 | Fleming, Jr. et al. |
| 5,308,745 A | 5/1994 | Schwartzkopf |
| 5,326,406 A | 7/1994 | Kaneko et al. |
| 5,372,651 A | 12/1994 | Kodama |
| 5,378,317 A | 1/1995 | Kashiwase et al. |
| 5,415,191 A | 5/1995 | Mashimo et al. |
| 5,464,480 A | 11/1995 | Matthews |
| 5,489,557 A | 2/1996 | Jolley |
| 5,503,708 A | 4/1996 | Koizumi et al. |
| 5,520,744 A | 5/1996 | Fujikawa et al. |
| 5,571,367 A | 11/1996 | Nakajima et al. |
| 5,632,847 A * | 5/1997 | Ohno et al. ................. 156/344 |
| 5,647,386 A | 7/1997 | Kaiser |
| 5,658,615 A | 8/1997 | Hasebe et al. |
| 5,705,089 A | 1/1998 | Sugihara et al. |
| 5,776,296 A | 7/1998 | Matthews |
| 5,803,982 A | 9/1998 | Kosofsky et al. |
| 5,832,177 A | 11/1998 | Shinagawa et al. |
| 5,858,107 A | 1/1999 | Chao et al. |
| 5,896,875 A | 4/1999 | Yoneda |
| 5,911,837 A | 6/1999 | Matthews |
| 5,944,907 A | 8/1999 | Ohmi |
| 5,950,643 A | 9/1999 | Miyazaki et al. |
| 5,964,952 A | 10/1999 | Kunze-Concewitz |
| 5,971,368 A | 10/1999 | Nelson et al. |
| 6,146,469 A | 11/2000 | Toshima |
| 6,249,933 B1 | 6/2001 | Berfield |
| 6,267,125 B1 | 7/2001 | Bergman et al. |
| 6,273,108 B1 | 8/2001 | Bergman et al. |
| 6,551,409 B1 | 4/2003 | DeGendt et al. |
| 6,589,359 B2 | 7/2003 | Kamikawa et al. |
| 2002/0011257 A1 | 1/2002 | DeGendt |

FOREIGN PATENT DOCUMENTS

| | | |
|---|---|---|
| EP | 0 472 441 | 8/1991 |
| EP | 0 587 889 | 5/1992 |
| EP | 0 548 596 | 11/1992 |

(List continued on next page.)

OTHER PUBLICATIONS

Golland, D. E., et al., "The Clean Module: Advanced Technology for Processing Silicon Wafers." *Semiconductor Int'l.*, pp. 154–157 (Sep. 1987).

(List continued on next page.)

*Primary Examiner*—M. Kornakov
(74) *Attorney, Agent, or Firm*—Perkins Coie LLP (57) ABSTRACT

The invention encompasses methods for cleaning surfaces of wafers or other semiconductor articles. Oxidizing is performed using an oxidation solution which is wetted onto the surface. The oxidation solution can include one or more of: water, ozone, hydrogen chloride, sulfuric acid, or hydrogen peroxide. A rinsing step removes the oxidation solution and inhibits further activity. The rinsed surface is thereafter preferably subjected to a drying step. The surface is exposed to an oxide removal vapor to remove semiconductor oxide therefrom. The oxide removal vapor can include one or more of: acids, such as a hydrogen halide, for example hydrogen fluoride or hydrogen chloride; water; isopropyl alcohol; or ozone. The processes can use centrifugal processing and spraying actions.

18 Claims, 3 Drawing Sheets

FOREIGN PATENT DOCUMENTS

| EP | 0 782 177 A2 | 7/1997 |
|---|---|---|
| JP | 52-12063 | 4/1977 |
| JP | S61-004232 | 1/1986 |
| JP | 62-117330 | 5/1987 |
| JP | 62 118528 | 5/1987 |
| JP | 63-110732 | 5/1988 |
| JP | H01-262627 | 10/1989 |
| JP | 02-164035 | 6/1990 |
| JP | 03-072626 | 3/1991 |
| JP | H03-208900 | 9/1991 |
| JP | H04-125927 | 4/1992 |
| JP | H04-298038 | 10/1992 |
| JP | 04 301245 | 10/1992 |
| JP | 4-302144 | 10/1992 |
| JP | 04-302145 | 10/1992 |
| JP | 04-326516 | 11/1992 |
| JP | 04-370931 | 12/1992 |
| JP | 05-013398 | 1/1993 |
| JP | 05-047741 | 2/1993 |
| JP | 05-109686 | 4/1993 |
| JP | 05-902329 | 4/1993 |
| JP | 05-183151 | 7/1993 |
| JP | 05-259139 | 10/1993 |
| JP | 05-283389 | 10/1993 |
| JP | 06-204130 | 7/1994 |
| JP | 07-159980 | 6/1995 |
| JP | 8-8222 | 1/1996 |
| JP | 08-08222 | 1/1996 |
| JP | 08-160032 | 6/1996 |

OTHER PUBLICATIONS

Abstract of JP 3041729 published Feb. 2, 1991.

Heyns, M. M., et al. "New Wet Cleaning Strategies for Obtaining Highly Reliable Thin Oxides," MRP Symposium Proceedings on Materials Research Society, Spring Meeting, San Francisco, Calif. Apr. 12–13, 1993, p. 35 (1993).

Adler, Marilyn Grace and Hall, George Richard, "The Kinetics and Mechanism of Hydroxide Ion Catalyzed Ozone Decomposition in Aqueous Solution" *J. Am. Chem. Soc.,* Vol. 72, pp. 1884–86, 1950.

Nelson, Steve, "Ozonated water for photoresist removal" *Solid State Technology,* pp. 107–112 (July 1999).

Christenson, Kurt K., et al. "Denionized Water Helps Remove Wafer Stripping 'Resist'–ance," www.precision-cleaningweb.com—*Precision Cleaning Web—Archieves,* pp. 10–20 (April 1998).

Sehested, K., et al., "Decomposition of Ozone in Aqueous Acid Solutions (pH 0–4)," *J. Phys. Chem.,* pp. 1005–1009 (1992).

Krusell, W. C. et al., "Cleaning Technology for High Volume Production of Silicon Wafers," *ECS Proc. of the First Int'l. Symposium on Cleaning Technology I Semiconductor Device Mfg.,* pp. 23–32 (October 1989).

Vig, John R., "UV/Ozone Cleaning of Surfaces: A Review," *Surface Contamination: Genesis, Detection, and Control,* pp. 235–253 (1979).

Tong, Jeremy, et al., "Aqueous Ozone Cleaning of Silicon Wafers," *ECS Extended Abstracts,* Phoenix, Ariz., Abstract No. 506, p. 753 (Oct. 13–17, 1991).

Zafonte, Leo, et al., "UV/Ozone Cleaning For Organics Removal on Silicon Wafers," *SPIE Optical Microlithography III: Technology for the Next Decade,* Vol. 470, pp. 164–175 (1984).

Baumgärtner, H., et al., "Ozone Cleaning of the SI–SIO$_2$ Systems," *Appl. Phys. A,* Vol. 43, pp. 223–226 (1987).

Isagawa, Tatsuhiko, et al., "Ultra Clean Surface Preparation Using Ozonized Ultrapure Water," *Extended Abstracts of the 1982 Int'l. Conf. on Solid State Devices and Materials,* pp. 193–195 (1992).

Shimada, H., et al., "Residual–Surfactant–Free Photoresist Development Process," *J. Electrochem., Soc.,* 193(6):1721–1730 (June 1992).

Tong, Jeremy K. et al., "Aqueous Ozone Cleaning of Silicon Wafers," *Proc. of 2$^{nd}$ Int'l. Symposium on Cleaning Tech. In Semiconductor Device Mfg.,* pp. 18–25 (October 1992).

Tong, Jeremy K., et al., "Aqueous Ozone Cleaning of Silicon Wafers," *Res. Soc. Symp.,* pp. 18–25 (1993).

Ohmi, T. et al., "Native Oxide Growth and Organic Impurity Removal of Si Surface with Ozone–Injected Ultrapure Water," *J. Electrochem. Soc.,* 140(3):804–810 (March 1993).

Vig. John R., et al., "UV/Ozone Cleaning of Surfaces," *IEEE Transactions on Parts, Hybrids, and Packaging,* Vol. PHP–12(4):365–370 (December 1976).

Vig, John R., "UV/Ozone cleaning of surfaces," *U.S. Army Electronics Technology and Devices Laboratory,* ERAD-COM, Ft. Monmouth, N.J. 07703–5302, pp. 1027–1034 (September/October 1984).

Tabe, Michiharu, "UV ozone cleaning of silicon substrates in silicon molecular beam epitaxy," *Appl. Phys. Lett.,* 45(10):1073–1075 (November 1984).

Zazzera, L. A., et al., "XPS and SIMS Study of Anhydrous HF and UV/Ozone–Modified Silicon (100) Surfaces," *J. Electrochem. Soc.,* 136(2):484–491 (February 1989).

Gabriel, Calvin, et al., "Reduced Device Damage Using An Ozone Based Photoresist Removal Process," *SPIE Advances in Resist Technology and Processing VI,* Vol. 1086, pp. 598–604 (1989).

Suemitus, Maki, et al., "Low Temperatures Silicon Surface Cleaning by HF Etching/Ultraviolet Ozone Cleaning (HF/UVOC) Method (I)–Optimization of the HF Treatment–," *Japanese Journal of Applied Physics,* 28(12):2421–2424 (December 1989).

Kern, Werner, "The Evolution of Silicon Wafer Cleaning Technology," *J. Electrochem. Soc.,* 137(6):1887–1892 (June 1990).

Kasi, Srinandan R., et al., "Vapor phase hydrocarbon removal for Si processing," *Appl. Phys. Lett.,* 57(20):2095–2097 (November 1990).

Huynh, Oue K., et al., "Plasma versus ozone photoresist ashing: Temperature effects on process–induced mobile contamination," *J. Vac. Sci. Technol.,* B9(2):353–356 (Mar./Apr. 1991).

Bedge, Satish, et al., "Kinetics of UV/O$_2$ Cleaning and Surface Passivation Experiments and Modeling," *Mat. Res. Soc. Symp. Proc.,* Vol. 259, pp. 207–212 (1992).

Goulding, M. R., "Selective epitaxial growth of silicon," *Materials Science and Engineering,* Vol. B17, pp. 47–67 (1993).

Ganesan, Gans S., et al., "Characterizing Organic Contamination in IC Package Assembly," *The Int'l. Soc. for Hybrid Microelectronics,* Vol. 17, #2, Second Quarter, pp. 152–160 (1994).

Egitto, F. D., et al., "Removal of Poly(Dimethylsiloxane) Contamination From Silicon Surfaces With UV/Ozone Treatment," *Mat. Res. Soc. Symp. Proc.,* Vol. 385, pp. 245–250 (1995).

Arnick, J. A., "Cleanliness and the Cleaning of Silicon Wafers," *Solid State Technology*, pp. 47–52 (November 1976).

Bolon, D. A., et al., "Ultraviolet Depolymerization of Photoresist Polymers," *Polymer Engineering and Science*, 12(2):108–111 (March 1972).

Krusell, W. C., et al., "The Characterization of Silicon Substrate Treatments by use of SIMS and MOS Electrical Testing," *ECS Extended Abstracts*, No. 229, p. 331–332 (1986).

Anantharaman, Ven, Ph. D., et al., "ORGANICS: Detection and Characterization of Organics in Semiconductor DI Water Processes," *Ultrapure Water*, pp. 30–36 (April 1994).

"Ozone Concentration Measurement In A Process Gas," *Proposed IOA Pan American Group Guideline*, pp. 1–21 (December 1993).

"Ozone for Semiconductor Applications," Sorbios, pp. 1–6 (October 1991).

* cited by examiner

FIG. 3

METHODS FOR CLEANING SEMICONDUCTOR SURFACES

PRIORITY CLAIM

This application is a Continuation of Ser. No. 09/811,925, filed Mar. 19, 2001, and now pending, which is a continuation of Ser. No. 08/853,649, filed May 9, 1997, and now U.S. Pat. No. 6,240,933, all of which are incorporated herein by reference.

TECHNICAL FIELD

This invention pertains to methods for cleaning surfaces of semiconductor articles, and more particularly to methods for cleaning silicon containing surfaces, such as on silicon semiconductor wafers.

BACKGROUND OF THE INVENTION

The production of semiconductors into various types of integrated circuits, displays, memories, sensors and other devices typically requires cleaning of semiconductor surfaces to remove contaminants. In many cases the presence of even small amounts of contamination on a semiconductor surface will impair or destroy operation of devices formed from the contaminated semiconductor material.

Figure 1:
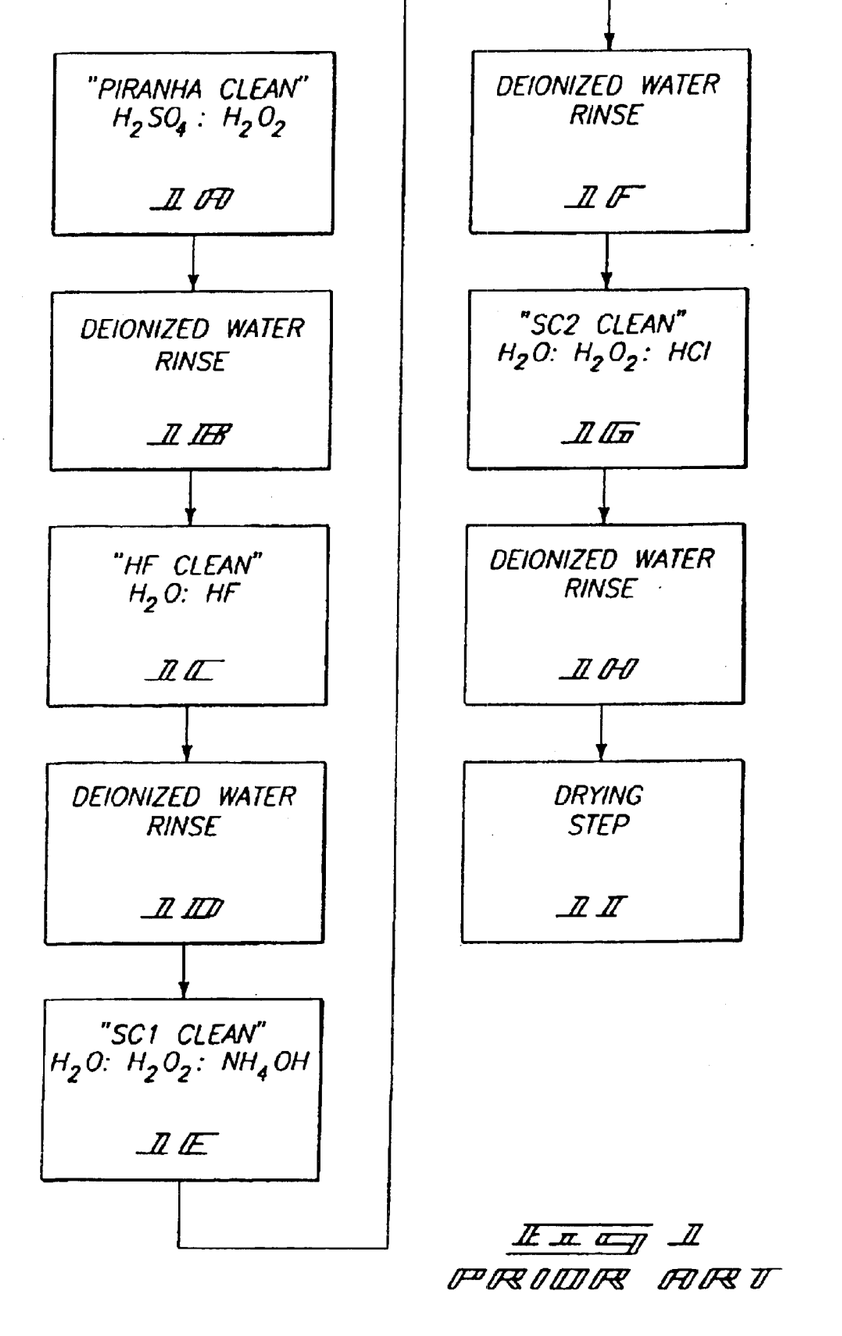
FIG. 1 is a block diagram of a prior art semiconductor wafer cleaning process.

A common semiconductor material used for production of semiconductor devices is silicon, which is most typically in the form of a silicon containing wafer. The so-called "RCA clean" has been the standard clean sequence utilized by the industry for cleaning silicon wafers for the past two decades. An RCA clean process is illustrated in FIG. 1, and comprises steps 1A–1I.

Referring to step 1A, one or more silicon-comprising semiconductor wafers are subjected to a so-called "piranha" cleaning step. The piranha cleaning step typically comprises dipping the wafers in an inorganic oxidant, such as a solution containing sulfuric acid and hydrogen peroxide. This step is intended to remove organic material from a surface of the semiconductor article. A typical piranha cleaning solution would comprise hydrogen peroxide ($H_2O_2$) and sulfuric acid ($H_2SO_4$) in a ratio of about 1:5 to about 1:50 (hydrogen peroxide:($H_2SO_4$)).

Referring to step 1B, the wafers are rinsed with deionized water. The deionized water rinse typically occurs at room temperatures, commonly from about 18° C. to about 23° C. Preferably, the rinse utilizes water with a high resistivity, such as from about 10 megohms-centimeter to about 18 megohms-centimeter.

Referring to step 1C, the wafers are subjected to a so-called "HF clean". The HF clean is typically used to remove an oxide film from the surfaces of the semiconductor wafers. Such oxide film may be formed, for example, during the above-discussed piranha clean or due to exposure of the semiconductor wafer or other article to air or other sources of oxygen. The HF clean typically involves dipping the wafers in a solution of water and hydrofluoric acid, with the water:hydrogen fluoride ratio commonly being in the range of from approximately 1000:1 to approximately 100:1.

Referring to step 1D, the semiconductor wafers are rinsed with deionized water to remove hydrogen fluoride and various materials loosened from the surface of the wafer.

Referring to step 1E, the wafers are subjected to a so-called "Standard Clean 1" step, commonly referred to as an "SC1" step. The SC1 step is principally directed to removing various particulate materials from the semiconductor surfaces which can more easily attach as a result of the surface being made hydrophobic by the hydrogen fluoride cleaning step explained above, step 1C. In a typical SC1 step, the wafers are submerged in a solution of water, hydrogen peroxide and ammonium hydroxide (for example 5:1:1 by volume), at temperatures from about 75° C. to about 80° C. for a time of from about 2 minutes to about 15 minutes.

Referring to step 1F, the wafers are subjected to a deionized water rinse to remove the above-described SC1 solution from the wafers. Typically, this rinse, like the rinse in step 1D, is relatively short to minimize regrowth of oxide on the wafers.

Referring to step 1G, the wafers are subjected to a so-called "Standard Clean 2" step, commonly referred to as an "SC2" step. The SC2 step is thought to desorb atomic and ionic contaminants from the wafers. In particular, the SC2 step is intended to remove metals deposited on the wafer surface during the HF cleaning step and SC1 step. In a typical SC2 step, the wafers are submerged in a solution of $H_2O:HCl:H_2O_2$ (for example 6:1:1 by volume). The SC2 step can be carried out at temperatures which are elevated above common room temperatures. Examples of elevated temperatures sometimes used are from about 75° C. to about 80° C. The SC2 step can be effected for various times, for example for times from about 1 to about 10 minutes.

Referring to step 1H, the wafers are subjected to a deionized water rinse, similar to the rinse described above regarding step 1D, to remove the above-described SC2 solution from the wafers.

Referring to step 1I, the wafers are subjected to a drying step. The drying step can be done using a variety of processes. Standard processes can include relatively more sophisticated isopropyl alcohol drying systems, spin rinse driers, and other drying technologies. One standard drying procedure employs a combined rinse and dry which involves: 1) loading a cassette of wafers into a rinse tank; 2) spraying the cassette with rinse water until the water reaches a predetermined level; and 3) quickly dumping the water. After several rinse/dump cycles, the wafers are typically dried by exposure to a heated nitrogen gas.

The above-described RCA clean has the disadvantage of requiring numerous discrete steps for wafer cleaning. This necessarily increases both equipment costs, costs of processing facility space, and costs for added labor and processing time to complete numerous processing steps. It has long been recognized that a standard cleaning process is needed for semiconductor articles which can provide both fewer discrete steps and the exceedingly high degree of cleanliness needed in the semiconductor processing industry.

The RCA clean also has the further disadvantage of requiring four distinct chemical based cleaning steps (steps 1A, 1C, 1F and 1H), each of which requires a different chemical bath solution. Accordingly, many types of equipment designed to perform the RCA clean require four distinct tanks of cleaning solutions: a tank for the piranha mixture, a tank for the hydrogen fluoride mixture, a tank for the SC1 mixture, and a tank for the SC2 mixture. This renders the equipment more expensive and bulky. There is also an ancillary requirement to dispose of spent chemicals. When more chemicals are used then there is associated increases in chemical disposal costs. Accordingly, it has long been recognized as strongly desirable to have improved cleaning processes which reduce the number and volume of chemicals needed to clean semiconductor articles.

BRIEF DESCRIPTION OF THE DRAWINGS

Preferred embodiments of the invention are described below with reference to the following accompanying drawings.

DETAILED OF DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention pertains to methods for cleaning surfaces of wafers and other semiconductor articles. The surfaces being cleaned can be made from a variety of semiconductor materials and formulations. The specific preferred processes described herein are most appropriately used in cleaning semiconductor surfaces which are principally or wholly silicon semiconductor surfaces.

The invention in part resides in or stems from a recognition that a significant amount of the contamination removed by the prior art RCA clean SC1 and SC2 steps (the above-described steps 1E and 1G) commonly originates as contamination in the upstream solutions of the RCA clean process. For instance, a significant amount of the metal contamination removed in the SC1 step frequently originates as contamination in the solutions utilized in the HF clean step (the above-described step 1C). Additionally, a significant portion of the contaminants removed during the SC2 step may originate from contaminated solutions utilized in the HF clean step (the above-described step 1C) or from contaminated solutions utilized in the SC1 step (the above-described step 1E). Accordingly, and as part of the invention it is recognized that it may be possible to eliminate one or both of the SC1 and SC2 steps of the RCA clean process by reducing contamination introduced by, during or prior to the HF clean step.

It should further be understood that the invention includes several processes which may include one or more of the various process steps described below, either alone or in combination with one or more of the other of the process steps described below. Although not all combinations may be fully appropriate or preferred, the various combinations of the disclosed steps are contemplated as part of the implementation of the novel concepts presented herein.

Processes Generally

Preferred methods according to several aspects of the present invention are discussed with reference to FIG. 2. The cleaning processes according to these first embodiments are most preferably illustrated as steps 2A–2D.

In one aspect the invention includes a first cleaning step, step 2A, which involves a first cleaning mixture or solution. The first cleaning mixture preferably includes at least one oxidizing agent as a constituent thereof. The first cleaning step removes contaminants, such as organic contaminants which are present on the surface. The first cleaning step can also include constituents which concurrently clean, dissolve or otherwise remove contaminants from the surface being treated. These actions can occur along with the preferred oxidizing action which both develops oxide on the surface of the semiconductor and tends to break up organics and other contaminants. The concurrent inclusion of other constituents, such as acids, can be used to remove contaminants such as metallic materials which sometimes plate or otherwise develop upon the surface of the semiconductor article. The first cleaning step is preferably performed by contacting a liquid upon the surface being treated, such as in a manner as described more fully below.

The cleaning processes in another aspect include a second step which is preferably a rinsing step. The preferred rinsing step helps to remove any materials which are oxidized, dissolved or otherwise removed from the surface in the first cleaning step. The rinsing step also serves to stop or inhibit further chemical activity associated with the constituents included in the first cleaning step. The second cleaning step is preferably performed by rinsing a rinsing solution or other rinsing liquid against or over the surface being treated.

The cleaning processes in another aspect preferably include drying the surface to remove residual moisture or other materials remaining from the prior cleaning and rinsing steps.

The cleaning processes in another aspect include removing oxide from the surface. The removing is preferably accomplished by exposing the surface to an oxide removal vapor. The oxide removal vapor includes a suitable oxide removal agent, for example vaporous hydrogen fluoride or a vapor mixture of hydrogen fluoride vapor and water vapor. Other constituents can also be included in the oxide removal vapor used. The oxide removal step is preferably accomplished without wetting the surface so that a subsequent drying step of the resulting surface is not needed. This is particularly of advantage when the surface being treated is left in a hydrophobic condition as a result of the oxide removal step.

The steps explained above will now be described in greater detail below. Alternative methods employing additional or alternative aspects of the invention will also be described below.

First Cleaning Step

Referring to step 2A, a surface of one or more wafers or other semiconductor articles are subjected to a first cleaning step. The first cleaning step preferably uses a first cleaning fluid, which is advantageously a mixture or solution containing primarily liquid constituents, but may also include entrained or dissolved gases with the liquids. The first cleaning step is performed to remove various contaminants from the surface being treated. The preferred first cleaning step more specifically includes an oxidizing action as at least part of the cleaning step. The oxidizing action is preferably effected by contacting the surface or surfaces with a first cleaning fluid which is advantageously an oxidizing solution that includes an oxidizing agent or agents as at least one constituent thereof.

One preferred oxidizing agent is ozone. Ozone is preferably introduced into the first cleaning solution in a variety of suitable ways. One preferred way of introducing the ozone into such solution or other fluid is to inject the ozone into a conduit through which a carrier or other constituents of the first cleaning fluid is or are being supplied. Another mode of using the ozone is to inject or bubble it into a tank which contains the carrier chemical or chemicals which are chosen. The ozone can go into solution or be partly entrained into the first cleaning fluid.

When ozone is used, then the first cleaning fluid preferably includes a carrier which can be relatively non-reactive, or can be itself a solvent, an oxidizing agent, or other agent serving additional cleaning and treatment purposes. One such carrier for ozone is water, more preferably deionized water, or alternatively distilled water, or distilled and deionized water. Other constituents of the first cleaning fluid also can be used and serve as carriers of the ozone. The ozone can either be dissolved into the liquid carrier or carriers, or it can be injected into a fluid supply stream which causes portions of the ozone gas to dissolve thereinto and other portions to be entrained into the fluid supply stream.

Ozone can also be introduced into the first cleaning fluid using a carrier gas which facilitates handling of the ozone. Examples of suitable carrier gases include oxygen, clean dry air, nitrogen, inert gases, and potentially other gases which do not by chemical makeup lead to rapid breakdown of ozone. The ozone is advantageously used in connection with carrier gases such as oxygen, air or nitrogen in concentrations ranging from about 1% to about 15% by weight relative to the other constituents of the carrier gas stream.

The resulting ozone and carrier gas stream is introduced into the first cleaning fluid in amounts sufficient to produce amounts of ozone in the processing chamber and first cleaning fluid which are effective to cause an oxidizing effect upon the surface being treated. For example ozone and carrier gas introduced into a flowing first cleaning fluid stream will advantageously be 1–10 liters per minute when injected into a first cleaning fluid stream which is in the range from about 1 liter per minute to about 10 liters per minute. Higher flows of the ozone carrier gas mixture in the approximate range of 5–10 liters per minute are used when injected with water or sulfuric acid. Whereas, lower flows of the ozone carrier gas mixture in the approximate range of 2–5 liters per minute are used when injected with water and hydrochloric acid.

The ozone can advantageously be used in deionized or other appropriate water in amounts sufficient to produce concentrations by weight of greater than about 0.001% ozone. More preferably, the ozone is included in amounts sufficient to produce concentrations by weight in the range from about 0.005% to about 0.01%. Such concentrations apply whether the carrier includes a carrier gas, water alone, other liquid constituents, or combinations thereof.

Other possible ozone carriers include acids, such as sulfuric acid ($H_2SO_4$) or hydrogen chloride (HCl), such as in the form of hydrochloric acid. The acids can potentially be used in concentrations ranging from anhydrous acids, highly concentrated or varying dilutions thereof. For example, concentrated sulfuric acid having approximately 96–98% sulfuric acid with the remainder water is suitable. Other acids may be provided in solutions of lower concentrations, such as aqueous solutions with water, or possibly solutions formed with alternative solvents or other constituents which also can serve as part of the carrier function or combined carrier and cleaning fluid activities. For example, relatively less concentrations is of hydrochloric acid in the range of about 1–5% may be used. These or other carriers used with ozone or other oxidizing agents can advantageously also serve added cleaning functions.

Ozone can be used with acids, such as the hydrochloric or sulfuric acids, in amounts sufficient to produce concentrations as recited above in connection with use of ozone with a carrier comprising deionized water, either alone or with other minor constituents.

One acid constituent used in some of the first cleaning liquids according to this invention is sulfuric acid. Sulfuric acid can be used in various concentrations ranging from approximately 1–100% by volume. More preferably, sulfuric acid is used in amounts which are complementary with the concentration of ozone, when ozone is used. If other ingredients are included, such as the hydrogen peroxide as explained below, then the sulfuric acid concentrations are reduced to accommodate the added constituents. A preferred sulfuric acid ozone mixture includes water in the amount of approximately 0–50% water, 0.001–0.01% ozone, and the balance being sulfuric acid and any other constituents.

Another suitable acid for use in the first cleaning fluid is hydrogen chloride in the preferred form of hydrochloric acid (HCl). The preferred concentration of hydrochloric acid differs from sulfuric acid. If other alternative acids are used, then concentrations will also typically vary dependent upon the acid selected and the particular types of contaminants being cleaned. When the acid selected is hydrochloric acid, then the preferred concentrations are from about 0.1% to about 10% HCl by weight, more preferably from about 0.5% to about 5% by weight. The remaining balance of the solution is in such cases are water, or more preferably a combination of water and ozone. When ozone is used, it is included in amounts sufficient to comprise the concentrations given above in connection with preferred ranges of ozone used in deionized water, or as more specifically indicated.

It should also be understood that the acids explained above can also be used as part of the first cleaning solution without necessarily including ozone mixed or in solution therewith. This is possible since the acid or other constituent of the carrier can potentially serve to perform an oxidizing function, or alternatively other oxidizing agents can be included in the first cleaning liquid in addition to any acids used therein.

Another constituent which can be included in the first cleaning solution is hydrogen peroxide ($H_2O_2$). Hydrogen peroxide serves as an oxidizing agent and can be mixed with a suitable carrier. Hydrogen peroxide is advantageously used with a carrier which acts as a diluent to reduce the concentration thereof due to its highly reactive nature. Suitable carriers include water or sulfuric acid, or combinations of water and sulfuric acid. The preferred water and sulfuric acid ranges are given above. The preferred ratios of hydrogen peroxide are from about 1% by volume hydrogen peroxide to about 20% hydrogen peroxide, relative to the carrier. In one embodiment the hydrogen peroxide is used in concentrations sufficient to produce a volumetric ratio of about 1:10 (hydrogen peroxide:sulfuric acid).

The temperatures used in the first cleaning step will vary dependent upon the constituency of the first cleaning liquid. In one preferred form of the invention which utilizes sulfuric acid, the temperatures used are elevated above room temperature and less than about 200° C., more preferably the temperature range is from about 50° C. to about 200° C., even more preferably from about 75° C. to about 150° C., still more preferably from about 90° C. to about 140° C.

In another form of the invention wherein hydrochloric acid is used as a constituent of the first cleaning liquid, the temperatures are operated in the range from about −5° C. to about 25° C., more preferably from 0° C. to about 20° C., even more preferably from about 5° C. to about 15° C.

The contacting of the first cleaning solution against the surface of the wafer or other semiconductor article can be effected in several different modes of operation. In one preferred mode of operation the cleaning solution is sprayed against the wafers. This is advantageously done within an enclosed processing chamber. It is also preferably done while simultaneously rotating the wafer or batch of wafers so that the spraying and contacting actions are done in a more uniform manner while also performing a rotating action. The preferred rotational speeds and volumetric flow rates are detailed below in connection with the description of the second cleaning or rinsing step which also apply equally to the first cleaning step, and such description will not be duplicated here.

When batches are being processed, then the wafers and any spray nozzles are preferably arranged so that the first cleaning solution is applied in an approximately uniform manner to all surfaces being treated. Another possible mode of operation for the first cleaning step is to provide the first cleaning solution in a tank or other container and to dip or otherwise bring the wafer or other semiconductor article into contact with the pool of cleaning liquid.

The amount of time needed to sufficiently complete the first cleaning step will vary dependent upon the type of constituents included in the first cleaning liquid, the type of article being processed, the prior processing experiences of the surface being treated, and the temperature at which the process is being performed. Other factors may also have some effect on processing times. In general the processing times will range from about 30 seconds to about 20 minutes, more preferably from about 1 minute to about 10 minutes.

Second Cleaning Step—Using Rinsing Liquid

Referring to step 2B, after the first cleaning step has been performed, the wafers are preferably rinsed with a suitable second cleaning liquid, such as a rinsing liquid. The rinsing liquid can advantageously be formed primarily or totally from deionized or other suitable purified water. Alternatively, other solvents, such as light alcohols or others, may also be possible in addition or substitution to the use of water as the preferred rinsing solvent.

The temperature of the rinsing or other second cleaning liquid is in the range from about 5° C. to about 100° C., more preferably from about 10° C. to about 50° C., even more preferably from about 15° C. to about 25° C.

The rinsing liquid can advantageously be sprayed upon the wafers or other semiconductor surfaces in a manner similar to the first cleaning liquid. In particular, the wafers or other semiconductor articles can advantageously be spun at desirable rotational speeds while simultaneously sprayed with water or other suitable rinsing liquids to dislodge any residual first cleaning step liquid and particles, organics, metals or other contaminants which may be on the surface or removed therefrom. The spraying can be done initially without rotational action followed by centrifugal action or intermittent centrifugal action to clear rinse liquid from the surfaces being cleaned. Centrifugal action may also be desirable for purposes of applying centrifugal forces which tend to dislodge contaminants from the surface being cleaned. Suitable rotational speeds are in the range from about 60 to about 3000 revolutions per minute, more preferably from about 200 to about 2000 revolutions per minute, even more preferably from about 300 to about 1500 revolutions per minute.

The volume of rinsing liquid used will depend on the number and size of wafers or other articles being rinsed. For batches having about twenty five silicon wafers of about 150 millimeters in diameter, a suitable flow rate is in the range from about ½ gallon per minute to about 10 gallons per minute, more preferably from about 1 gallon per minute to about 5 gallons per minute, even more preferably from about 2 to about 4 gallons per minute.

The preferred combined spray and centrifugal rinsing is advantageously performed for a suitable period of time to remove most or all of the residual first cleaning step liquid from the surface of the semiconductor article. The spraying and spinning action can be performed for a period from about 1 minute to about 20 minutes, more preferably from about 2 minutes to about 10 minutes, even more preferably from about 3 minutes to about 5 minutes.

Alternatively, the rinsing liquid can be applied against the surface by immersing within a tank or reservoir of rinsing liquid using a variety of techniques which are well-known in the art of semiconductor processing. Rinsing times for immersion processing will typically be about one-half of the times given immediate above with regard to spinning-spray processing.

Third Cleaning Step—Drying Surface

Figure 2:
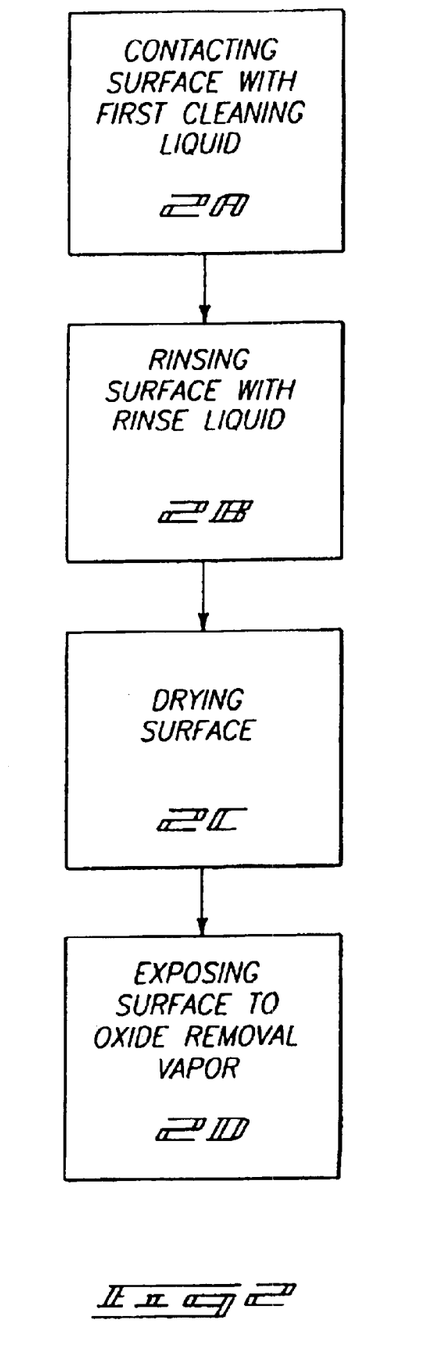
FIG. 2 is a block diagram of a first embodiment cleaning process of the present invention.

Referring to step 2C of FIG. 2, the wafers are preferably dried after the rinsing step. The drying is primarily for the purpose of removing any residual rinse liquid, such as rinse water, or to remove other processing liquids which may otherwise be present from the first or second cleaning steps. The drying is advantageously performed prior to removing oxides using the oxide removal vapors described in greater detail below. The drying step is significant in removing significant amounts of water or other liquids which may cause the oxide removal step to progress at varying rates and degrees of activity. The drying is also advantageously performed prior to the oxide removal step in order to prevent the need for significant drying after oxide is removed. The removal of oxide can leave the surface hydrophobic or otherwise more susceptible to particle attachment or other adherence from contaminants which become deposited thereon. Such a surface tends to cause adherence in a manner which renders the contaminants difficult to remove.

The drying step is advantageously accomplished by passing a flow of clean dry air, nitrogen, inert gases, or other suitable drying gases over the surfaces being dried. The use of nitrogen is advantageous due to relatively easy availability and well-established techniques for rendering the surfaces clean and dry.

The volumes of drying gas and temperatures used can vary considerably. Increased flow rates and higher temperatures tend to decrease drying times. Typical volumetric rates for a centrifugal batch processor as explained above are in the range from about 1 to about 100 liters per minute. Temperatures will typically be in the range from about 15° C. to about 100° C. Associated drying time will typically range from about 2 minutes to about 20 minutes, more preferably from about 4 minutes to about 10 minutes.

The drying action can be done without centrifugal action, or more preferably is done simultaneously with centrifugal action to help clear rinse liquid from the surfaces and minimize drying times. Rotational speeds similar to those set out above apply to any rotation employed during the drying step.

Other drying techniques may alternatively be employed such as condensing an organic film to displace water and then drying the organic material from the surface. An example organic film is isopropyl alcohol.

Fourth Cleaning Step—Removing Oxide from Surface

Referring to step 2D, the surfaces being cleaned are also preferably subjected to an oxide removal step as part of the cleaning process. The oxide removal process helps to remove any particles or other contaminants which may be embedded within, adsorbed or absorbed upon, or otherwise adhered to the oxide layer present upon the surface of the wafer or other semiconductor article being cleaned. The oxide removal process utilizes an oxide removal agent which is referably presented as a gas or other vapor as compared to treatment as a liquid. Treatment with a vapor eliminates the need for a subsequent drying step. Treatment with a vapor also minimizes the risk of imparting various metallic contaminants which may be easily picked up by the oxide removal agents if employed in a liquid form. Vapor processing has also been found advantageous as part of the invention since even if some metallic or other contaminants may be present in the liquid source materials, the use of vapors generated from the liquid source materials tends to provide a purer processing fluid than if liquid is employed. This may be true since heavier contaminants will tend to stay in the liquid phase as distinct from the vapors which are generated therefrom.

The use of hydrogen halide vapor in step 2D can reduce or eliminate previous metallic contamination of wafers which occurred during the above-discussed use of hydrogen halide solution in 1C of the RCA process. Specifically, many contaminants, particularly metallic contaminants, remain primarily in a solution as hydrogen halide vapors are generated from the solution. Hydrogen halide vapors are therefore generally a preferred source of hydrogen halide than are hydrogen halide solutions in liquid form.

Preferred oxide removal agents include hydrogen halides which are preferably provided in the indicated vapor form. One preferred hydrogen halide is hydrogen fluoride. Other hydrogen halides may also be useful depending upon the type of semiconductor oxide being removed. Hydrogen fluoride is a preferred hydrogen halide for use in step 2D due to its high effectiveness in removing silicon oxides, and in part because of its relatively high volatility compared to other hydrogen halides. However, other hydrogen halides, in addition to or in substitution for hydrogen fluoride, may provide specific advantages for step 2D. For instance, hydrogen chloride would have the advantages that a significant amount of hydrogen chloride is typically already present at semiconductor processing sites, as hydrogen chloride is typically used in such sites for removal of metals during semiconductor wafer processing. Accordingly, in certain applications it may be desirable to replace the generally preferred hydrogen fluoride vapor in whole or in part with hydrogen chloride vapor.

Hydrogen fluoride or other oxide removal vapors can be generated by using a liquid mixture or solution comprising the active oxide removal agent, such as hydrogen fluoride, and a diluent. Suitable diluents include water and isopropyl alcohol, or mixtures of water and isopropyl alcohol. The active hydrogen fluoride and/or other oxide removal agents are included in sufficient vapor concentrations to provide desirable oxide removal rates. In the case of hydrogen fluoride (HF), the vapor mixtures generated from either HF diluted with water or isopropyl alcohol or mixtures thereof are generally in the range from about 1:10,000 to about 1:1 (HF:diluents), more preferably from about 1:1000 to about 1:1, even more preferably from about 1:100 to about 1:1, for example 1:10–1:1.

The vaporous hydrogen halides or other oxide removal agent or agents can be communicated to the surface of the wafer using a suitable carrier gas. Examples of suitable carrier gases include clean dry air, nitrogen, and inert gases. The amount of carrier gas used will vary the vapor concentration of the active oxide removal agent. In many situations the diluent carrier gas will comprise from about 1:500 to about 1:5000 (active vapors:diluent carrier gas).

In many of the preferred processes according to this invention the vapors are generated from liquid source materials by passing a carrier or feed gas thereover or therethrough. Due to the dilution brought about by the carrier gas, the preferred concentrations of liquid constituents used in the liquid source materials will typically be more concentrated than the desired vapor concentrations developed in the processing chamber. For example when HF is used with water or isopropyl alcohol, the liquid proportions will generally be in the range from about 1:1,000 to about 1,000:1 (liquid HF:liquid diluents), more preferably from about 1:100 to about 100:1, even more preferably from about 1:10 to about 10:1, for example 1:1.

It has been found experimentally that in the absence of isopropyl alcohol, a hydrogen fluoride vapor treatment works better when run in a natural polyethylene chamber, than when run in a tetrafluoroethylene (PTFE) Teflon chamber. This may be due to the porosity and amount of absorbed moisture in the PTFE chamber contributing to instability of the hydrogen fluoride treatment process.

By utilizing the novel processes described herein, including the relatively pure hydrogen halide vapors instead of the prior art use of liquid hydrogen halide liquid solutions, it is possible to eliminate one or more steps from the prior art cleaning processes commonly referred to as the RCA cleaning processes. For instance, by utilizing hydrogen fluoride vapor in step 2D it is possible to eliminate steps 1E–1I of the prior art RCA clean process. (Compare, FIG. 1 prior art RCA process with the FIG. 2 embodiment of the present invention.)

Alternative Oxide Removal Step

In other aspects of the FIG. 2 embodiment, step 2D may comprise treatment with a mixture of hydrogen halide vapor and ozone. Most preferably, the hydrogen halide vapor will be hydrogen fluoride vapor. Such simultaneous treatment with ozone and hydrogen fluoride vapor believed to create a continuous etch-oxidation cycle wherein the ozone performs by generating oxide film, and the oxide removal agent performs by concurrently removing the oxide film. This continuous etch-oxidation removal cycle may be particularly advantageous in applications wherein one or two microns of material is to be removed from a silicon-comprising wafer, such as in a stress relief etch. Also, such treatment may be advantageous for removal of several angstroms of silicon-comprising material, such as when it is necessary to remove material from exposed surfaces prior to metal deposition to insure good ohmic contacts.

It is noted that in applications utilizing a mixture of ozone and hydrogen halide vapors, it is most preferable to exclude isopropyl alcohol and other organic vapors from the vapor mixture to reduce the risk of uncontrolled reactions, such as fire and/or explosion. It is also advantageous to exclude organic liquids or vapors which may result therefrom with regard to the previous rinsing and drying steps.

Ozone generation is preferably from diatomic oxygen and can be accompanied by mixtures of nitrogen and carbon dioxide gases which also serve to form a blended carrier gas for the ozone. Ozone concentrations in the gas stream are typically in the range from about 1% to about 10% by weight. Flow rates are typically from about 1 liter per minute to about 15 liters per minute.

The ozone containing gas stream can advantageously be used as a feed gas to a vapor generator which generates vapors of HF. Alternatively, the ozone bearing gas stream can be independently introduced into a processing chamber, or more preferably, blended into a vapor stream bearing the HF and other constituents carrying the etching or oxide removal vapor to the processing chamber.

The specific mixture of ozone and oxide removal vapors can be constituted to control the rate of silicon oxidation and the concurrent rate of oxide removal. The resulting net rate of change in the oxide layer thickness can accordingly be controlled. The simultaneous oxide removal and oxide growth causes sub-layers of oxide to be exposed and removal of particles is thereby facilitated.

Second Alternative Oxide Removal Step

Other alternative processes according to the invention include adding additional vapor streams to the active oxide removal agent and diluent solvent or solvents used therewith as described herein. In particular it is believed that vapor mixtures of hydrogen halide oxide removal agents, such as HF, diluted with isopropyl alcohol and water are suitable for combination with additional vapor streams. Example additional vapor streams include metals solubilizing agents, such as a hydrogen halide or mixture of hydrogen halides, in particular hydrogen chloride, preferably in the form of diluted hydrochloric acid vapors. Exemplary concentrations are in the preferred ranges given above in connection with the hydrogen fluoride vapor concentrations and such apply to both the HF component and the supplemental secondary or additional mixed components. Other metals solubilizing acids may also be suitable for inclusion in the vapor phase oxide removal step.

The combination of vapors for both oxide removal and metals solubilization may have synergistic effects in which improved wafer processing is achieved. Although the mechanism may or may not be fully understood, it is hypothesized that the strong inter-molecular forces are developed between metallic fluorides and more volatile components of the vapor stream, such as HF and water which are highly polar molecules that can form hydrogen bonds with metallic fluorides which may be formed.

It is possible to mix various aqueous hydrogen halide solution in a single vapor generator. However, control of such mixtures can become difficult due to differing vapor pressures of the constituent hydrogen halides or other mixed constituents. Therefore, it may be desirable to separately generate the various vapors and then mix the resulting vapor streams in a feed line or in the processing chamber itself. The preferred hydrogen halide vapors can advantageously be generated from aqueous mixtures of each hydrogen halide in separate vapor generators and then the streams are mixed using precise control of the flow rate of each vapor stream. Most preferably, an inert carrier, such as nitrogen gas is passed through the vapor generators. The flow rate of the carrier may vary from about 1 to about 60 liters per minute. The vapor generators are advantageously kept in the temperature range from about 100 to about 30° C., more preferably from about 20° to about 25° C. When the mixture is a preferred mixture containing HF and HCl, the HF concentration can range from about 1% to about 50% by weight, and HCl concentrations can range from about 1% to about 30% by weight. These vapor streams can be mixed with an organic vapor stream, such as isopropyl alcohol, or isopropyl alcohol can be included in the liquid mixture from which one or both of the hydrogen halides are preferably individually vaporized. Additional aspects of mixed acid vapors are explained in my prior U.S. Pat. No. 5,232,511 which is incorporated by reference in its entirety.

Alternative Embodiment Cleaning Processes

Figure 3:
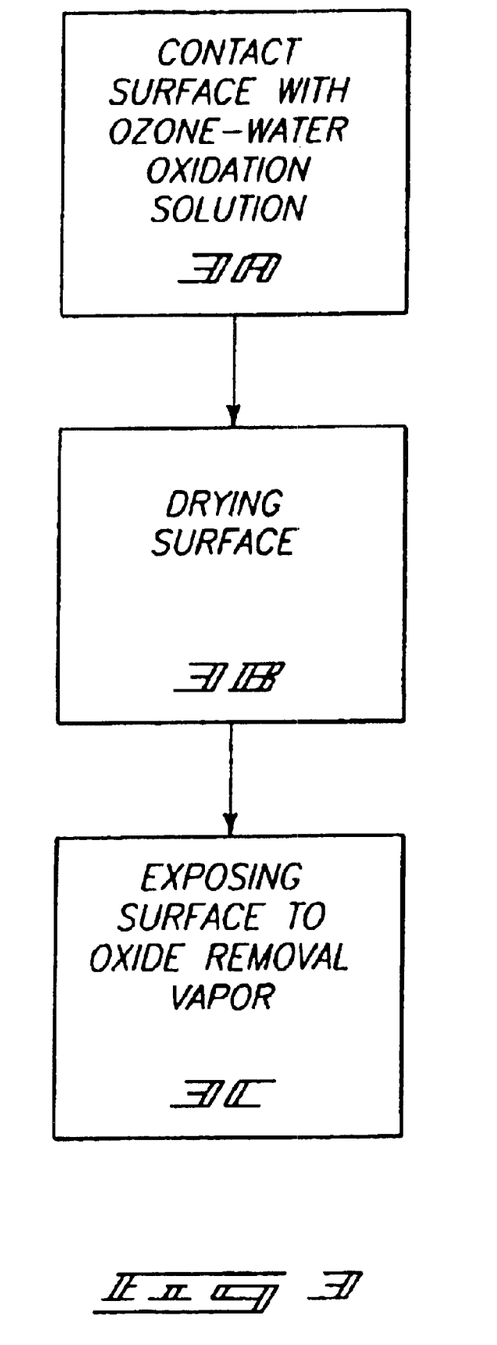
FIG. 3 is a block diagram of an alternative embodiment cleaning process according to aspects of the present invention.

Further embodiments of preferred methods according to the present invention are illustrated in FIG. 3. These methods bear similarity to the methods described hereinabove with variations therefrom as specifically described below. FIG. 3 shows that these embodiments comprise steps 3A–3C.

Referring to step 3A, one or more semiconductor wafers or other semiconductor articles being cleaned are exposed to a first cleaning step which comprises water and ozone. The water and ozone are as described above. Other chemical constituents are typically limited or eliminated so as to reduce, or more preferably, eliminate the need for a rinsing step as described above. The ozone performs the oxidization agent function and the simultaneous use of the carrier liquid in the form of purified water functions to rinse the surfaces to reduce or eliminate contaminants present thereon. Additional rinsing is expected to not be needed. Processing steps are otherwise as described above in connection with the processes in connection with FIG. 2.

Further Alternative Embodiment Methods

The embodiments of FIGS. 2 and 3 eliminate the SC1 step (step 1F) of the typical prior art RCA clean. Such removal of the SC1 step may be disadvantageous in certain applications, as the SC1 clean is currently one of the better methods known for removing particles from a silicon wafer. For instance, wafers containing a high amount of particles (which are most wafers after they have been subjected to processing, as such wafers typically comprise deposited photoresist or other organic materials upon them) may be difficult to clean without a particle removing SC1-type step. Therefore, a hybrid method of the invention is proposed to incorporate the SC1 step after the first cleaning step and second cleaning step. The SC1 step would be followed by a rinsing step similar to the second cleaning step described above. Thereafter the drying and vapor processing steps described above would be employed. Preferred concentrations for the water, hydrogen peroxide, and ammonium hydroxide constituents of the preferred SC1 step range between about 100:10:1 (water:hydrogen peroxide:ammonium hydroxide) to about 5:2:1.

The above discussed embodiments are thought to offer a process by which a hydrophobic surface may be formed on a semiconductor surface, such as a silicon-comprising wafer, by developing an oxide followed by etching or removing the developed oxide film without depositing metals or particles. Additionally, since the wafers are never wetted in a hydrophobic state, advanced drying technologies are not necessary.

EXAMPLE 1

Silicon wafers having a diameter of approximately 150 millimeters where intentionally contaminated by immersion in a high pH solution (pH approximately 9–10) containing aluminum and iron ions. Such ions tend to plate onto silicon surfaces in such high pH environments. Control wafers were left unprocessed and the results are shown in the following Table 1.

Standard cleaning procedure wafers were processed according to prior art techniques using a process similar to FIG. 1 using the following process parameters. Processing was conducted in a centrifugal spray acid processor produced by Semitool, Inc. of Kalispell Mont., Model SAT. The centrifugal spray acid processor can be adapted to include mixing features as explained in the copending U.S. patent application Ser. No. 08/607,627 filed Feb. 26, 1996 which is hereby incorporated hereinto in its entirety to provide explanation of exemplary systems used to mix gaseous phase carriers and vapors generated from liquids. Such application is attached hereto as an Appendix for convenience.

The piranha clean, step 1A, utilized 10 parts sulfuric acid (~96%) to 1 part hydrogen peroxide. The piranha clean was conducted at approximately 130° C. for a period of 5 minutes at rotational speeds of approximately 100 revolutions per minute. Step 1B was done using room temperature deionized water for about 3 minutes at 2 gallons per minute in the centrifugal spray processor at similar rotational speeds to step 1A. Step 1C was conducted using 100:1 (water:HF) which was sprayed for 30 seconds onto wafers rotating at similar speeds. Step 1D rinsing was conducted similar to step 1B.

Step 1E utilized 5:1:0.25 (water:hydrogen peroxide:ammonium hydroxide) at room temperature for a period of 5 minutes and at rotational speeds similar to step 1A. Rinsing step 1F was similar to step 1B. Step 1G utilized 5:1:1 (water:hydrogen peroxide:hydrogen chloride) at room temperature for a period of 90 seconds and at rotational speeds similar to step 1A. The results for the standard clean are shown in the following Table 1.

Table 1 also shows results for a Cleaning Process A which involved the following processing parameters. In conjunction with step 2A, ozone was injected into a first cleaning mixture of sulfuric acid (~96%) and hydrogen peroxide in ratios of 10:1 (sulfuric acid:hydrogen peroxide). The cleaning mixture was at elevated temperatures in the range of approximately 90° C. The ozone was provided in a carrier gas of oxygen with combined flow rate of 10 liters per minute, the ozone making up approximately 8% by weight of the flowing gas stream. Rotational speeds were as described relative to step 1A. Flow rate of the first cleaning mixture was approximately 20 liters per minute sprayed onto the rotating wafers for a period of about 5 minutes. Step 2B involved spraying deionized water in a manner similar to the description of step 1B. The drying step 2C was performed using nitrogen in manner similar to step 1E.

Step 2D was performed for a period of about 5 minutes using a vapor mixture of HF and isopropyl alcohol generated using a ratio of liquids equal to 1:100 (HF:isopropyl alcohol) at room temperatures (20° C.). The oxide removal step was targeted to remove about 50 angstroms thickness of silicon oxides.

Table 1 further shows results for a Cleaning Process B which was performed in the following manner. The first cleaning mixture included hydrogen chloride (HCl) supplied in the form of a 37% solution thereof in water. Such a 37% solution of HCl was included in amounts sufficient to provide a concentration thereof equal to 2% by volume with water. Ozone was also included in solution therewith. Ozone and carrier gas oxygen were injected into the flowing stream of cleaning liquid at a flow rate of about 7 liters per minute, with ozone making about 8% by weight of the flowing gas stream.

The rinsing, drying and oxide removal steps 2B, 2C and 2D were similar to those described above in connection with the Cleaning Process A.

The results shown in Table 1 indicate approximate metals concentrations on the cleaned surface using vapor phase decomposition ion-coupled plasma mass spectrometry. The performance of the Cleaning Process A and Cleaning Process B are superior with respect to some of the metals analyzed and less effective with regard to other metals. In almost all cases the performance was either better or sufficiently similar to performance demonstrated by the RCA clean described above so as to be a commercially viable alternative thereto.

TABLE 1

| | $10^{10}$ Atoms/cm$^2$ | | | | | | |
|---|---|---|---|---|---|---|---|
| Sample Type | Na | Al | Cr | Fe | Ni | Cu | Zn |
| Control | 14 | 2300 | 0.4 | 650 | 0.2 | 1.3 | 10 |
| Standard clean | 2.4 | 13 | <0.1 | <0.6 | <0.1 | 0.1 | <0.5 |
| Cleaning Process "A" | 18 | 9.8 | <0.1 | <0.6 | <0.1 | 0.1 | 0.5 |
| Cleaning Process "B" | 1.6 | 120 | <0.1 | 4.6 | <0.1 | <0.1 | <0.5 |

EXAMPLE 2

Table 2 shows processes as described in connection with Example 1 conducted upon wafers which were intentionally contaminated by immersion in an aqueous solution containing a small amount of n-methyl pyrolidone. The wafers were processed through the respective cleaning or control regimes and then analyzed using X-ray phosphorescence spectroscopy to evaluate the residual carbon and other results indicated.

TABLE 2

| | Atomic Concentration (%) | | | | | | |
|---|---|---|---|---|---|---|---|
| Sample Type | C | O | N | F | Si | % elemental Si | % oxide Si |
| Control | 2.7 | 33.2 | — | 0.3 | 63.9 | 90 | 10 |
| Standard clean | 2.3 | 29.5 | 0.1 | 0.3 | 67.9 | 89 | 11 |
| Cleaning Process "A" | 1.7 | 4.4 | 0.1 | 0.9 | 92.7 | 100 | 0 |
| Cleaning Process "B" | 1.6 | 4.4 | — | 0.8 | 93.2 | 100 | 0 |

EXAMPLE 3

Table 3 shows processes as described in connection with Example 1 conducted upon wafers which were intentionally contaminated by immersion in an aqueous solution containing a small amount of ethylene glycol. The wafers were processed through the respective cleaning or control regimes and then analyzed using X-ray phosphorescence spectroscopy to evaluate the residual carbon and other results indicated.

TABLE 3

| | Atomic Concentration (%) | | | | | | |
|---|---|---|---|---|---|---|---|
| Sample Type | C | O | N | F | Si | % elemental Si | % oxide Si |
| Control | 23.3 | 33.2 | — | 0.3 | 63.9 | 90 | 10 |
| Standard clean | 4.7 | 30.0 | 0.1 | 0.4 | 64.8 | 89 | 11 |
| Cleaning Process "A" | 2.2 | 4.1 | 0.1 | 0.9 | 92.7 | 100 | 0 |
| Cleaning Process "B" | 1.9 | 4.2 | — | 0.9 | 93.0 | 100 | 0 |

EXAMPLE 4

Virgin silicon wafers were processed using processes as described in connection with Example 1. This was done to indicate the amount of metals contamination which might be associated with the various cleaning processes themselves. Analysis was performed using vapor phase decomposition ion-coupled plasma mass spectrometry. The results are shown in Table 4.

TABLE 4

| | $10^{10}$ Atoms/cm$^2$ | | | | | | |
|---|---|---|---|---|---|---|---|
| Sample Type | Na | Al | Cr | Fe | Ni | Cu | Zn |
| Control | 12 | 0.8 | 1.4 | 5.1 | 0.7 | 0.1 | <0.5 |
| Standard clean | 9.2 | 13 | <0.1 | <0.6 | <0.1 | <0.1 | 0.6 |
| Cleaning Process "A" | 16 | <0.5 | <0.1 | <0.6 | <0.1 | 0.2 | 0.5 |
| Cleaning Process "B" | 2.6 | <0.5 | <0.1 | <0.6 | <0.1 | 0.4 | <0.5 |

EXAMPLE 5

Wafers can be processed using a deionized water ozone mixture. Ozone is injected as a gas stream having a concentration of ozone in nitrogen, clean dry air, or other carrier gas which is preferably in the range of 5–15% ozone by volume in the gas stream, more preferably 7–10% ozone. The deionized water ozone and carrier gas mixture is sprayed against the wafers in step 3A for a period of time sufficient to produce the desired degree of oxidation and breakup of surface contamination. Appropriate times are believed to be approximately 10–20 minutes. Rotation advantageously occurs at the same rotational speeds as indicated for step 1B, explained above. Temperatures in the range of 50–90° C. are advantageously used.

Steps 3B and 3C are performed as indicated above with regard to steps 2C and 2D.

EXAMPLE 6

Silicon wafers can be processed using a process similar to that described in Example 1 with regard to steps 2A, 2B, and 2C. Step 2D can be performed using a mixture of ozone and HF vapor generated using a feed gas stream having an approximate ozone concentration of 8% by weight of the feed gas. This feed gas is passed through a vapor generator at a rate of about 8 liters per minute. The vapor generator contains a liquid mixture of water and HF which is 5% by weight HF. Net oxide removal rates of 20 angstroms per minute are expected. The rate of oxide removal can be adjusted by feeding into the processing chamber a second vapor stream generated in a second vapor generator which produces water vapor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for cleaning semiconductor articles, comprising the steps of:
   placing one or more articles into a chamber;
   rotating the articles within the chamber;
   applying a heated liquid comprising water onto the rotating articles;
   introducing ozone gas and carbon dioxide gas into the chamber, with the ozone oxidizing contaminants on the articles, to clean the articles.
2. The method of claim 1 wherein the liquid is heated to 50–200 C.
3. The method of claim 1 wherein the liquid is heated to 75–150 C.
4. The method of claim 1 wherein the liquid includes an acid.
5. The method of claim 1 further including the step of rinsing the articles.
6. The method of claim 5 further including the step of drying the articles.
7. The method of claim 6 further including the step of drying the articles using isopropyl alcohol.
8. The method of claim 1 wherein at least some of the ozone is entrained in the liquid, before the liquid is applied to the articles.
9. The method of claim 1 wherein the heated liquid is sprayed onto the articles.
10. The method of claim 1 wherein the articles comprise semiconductor material wafers.
11. The method of claim 1 wherein the liquid includes hydrogen peroxide.
12. A method for cleaning a wafer, comprising the steps of:
    rotating the wafer;
    applying a liquid comprising water onto the rotating wafer, with the liquid heated to 50–200 C;
    supplying ozone gas and carbon dioxide gas to the wafer, with the ozone oxidizing contaminants on the wafer, to clean the wafer.
13. The method of claim 12 wherein at least some of the ozone is entrained in the liquid, before the liquid is applied to the articles.
14. The method of claim 12 further including the step of placing the wafer into a chamber, and wherein the ozone gas is mixed with the carbon dioxide gas before the gases are supplied to the wafer in the chamber.
15. The method of claim 12 wherein the heated liquid is sprayed onto the rotating wafer.
16. A method for cleaning semiconductor wafers, comprising the steps of:
    placing the wafers into a chamber;
    rotating the wafers;
    applying a liquid including water heated to 50–200 C generally uniformly onto the wafers;
    providing ozone gas and carbon dioxide gas into the chamber, with the ozone oxidizing contaminants on the surface of the article.
17. The method of claim 16 with the some of the ozone gas entrained into the liquid, before the liquid is applied to the wafers.
18. The method of claim 16 further including the step of applying the liquid by spraying.

* * * * *